US006856670B2

(12) United States Patent
Hoheisel

(10) Patent No.: US 6,856,670 B2
(45) Date of Patent: Feb. 15, 2005

(54) X-RAY DIAGNOSTICS INSTALLATION WITH A FLEXIBLE SOLID STATE X-RAY DETECTOR

(75) Inventor: Martin Hoheisel, Erlangen (DE)

(73) Assignee: Siemens Aktiengesellschaft, Münich (DE)

( * ) Notice: Subject to any disclaimer, the term of this patent is extended or adjusted under 35 U.S.C. 154(b) by 206 days.

(21) Appl. No.: 10/206,730

(22) Filed: Jul. 26, 2002

(65) Prior Publication Data

US 2003/0031296 A1 Feb. 13, 2003

(30) Foreign Application Priority Data

Jul. 27, 2001 (DE) .......................................... 101 36 756

(51) Int. Cl.[7] .............................................. G01T 1/24
(52) U.S. Cl. ................................ 378/98.8; 250/370.09; 250/370.11
(58) Field of Search ...................... 378/98, 98.2, 98.8; 250/370.1, 370.08, 370.09, 370.11

(56) References Cited

U.S. PATENT DOCUMENTS

| | | | | |
|---|---|---|---|---|
| 5,548,122 A | * | 8/1996 | Shoji ..................... | 250/370.09 |
| 5,608,775 A | * | 3/1997 | Hassler et al. ............. | 378/98.8 |
| 5,712,486 A | * | 1/1998 | Soltani et al. ............. | 378/184 |
| 5,880,472 A | * | 3/1999 | Polischuk et al. ..... | 250/370.09 |
| 6,303,943 B1 | * | 10/2001 | Yu et al. ........................ | 257/40 |
| 6,310,357 B1 | | 10/2001 | Fuchs et al. | |
| 6,362,481 B1 | | 3/2002 | Warren | |
| 6,559,449 B2 | * | 5/2003 | Ikeda et al. ............. | 250/370.09 |
| 2004/0016886 A1 | * | 1/2004 | Ringermacher et al. ..................... | 250/370.11 |

FOREIGN PATENT DOCUMENTS

EP        0 575 800        12/1993

OTHER PUBLICATIONS

"Stability of Low–Temperature Amorphous Silicon Thin Film Transistors Formed on Glass and Transparent Plastic Substrates," Yang et al, J. Vac. Sci. Technol. B vol. 18, No. 2, Mar./Apr. 2000, pp. 683–689.
"Thin Film Transistors For Displays on Plastic Substrates," Lee et al, Solid State Electronics, vol. 44 (2000) pp. 1431–1434.
"120° C. Fabrication Technology For a–Si:H Thin Film Transistors on Flexible Polymide Substrates," Sazonov et al, J. Va. Sci. Technol. A, vol. 18, No. 2, Mar./Apr. 2000, pp. 780–782.
"Matrix of Light Sensors Addressed by a–Si:H TFTs On A Flexible Plastic Substrate," Polach et al, Proceedings of the SPIE, vol. 3649 (1999), pp. 31–39.
"Flexible, Lightweight Steel–Foil Substrates for Amorphous Silicon Thin–Film Transistors," Theiss et al, Proc. Of Int. Workshop on Active–Matrix Liquid–Crystal Display, IDW'96 Kobe, Japan (1996), pp. 365–368.

* cited by examiner

Primary Examiner—Edward J. Glick
Assistant Examiner—Chih-Cheng Glen Kao
(74) Attorney, Agent, or Firm—Schiff Hardin LLP

(57) ABSTRACT

An X-ray diagnostics installation has an X-ray tube, a voltage generator, a solid state X-ray detector, an image system and a playback device. The solid state X-ray detector is fashioned flexible and includes a flexible housing, a flexible substrate with a matrix of thin-film transistors (TFT), and a flexible X-ray converter.

4 Claims, 3 Drawing Sheets

X-RAY DIAGNOSTICS INSTALLATION WITH A FLEXIBLE SOLID STATE X-RAY DETECTOR

BACKGROUND OF THE INVENTION

1. Field of the Invention

The present invention is directed to an X-ray diagnostic installation of the type having an X-ray tube, a voltage generator, a solid state X-ray detector, an image system and a playback device.

2. Description of the Prior Art

Various methods are in use for registering medical projection X-ray images. The following exposure systems are currently employed:

(1) cassettes with films in combination with scintillation foils;

(2) cassettes with storage foils;

(3) X-ray image intensifier with following camera; and (4) solid state detectors.

The exposure systems deliver the X-ray images either only after being developed (1) or read out (2) or they are heavy and bulky (3 and 4). Rigid cassettes with film/foil systems (1) or storage foils (2) that exhibit the above disadvantages have been hitherto employed for mobile applications. A lightweight detector that supplies the images in real time and is sufficiently flat so that it also could be employed in bed exposures would, however, be more desirable. Another unfavorable aspect of the aforementioned conventional detectors is that they are rigid and cannot be adapted to the surface profile of the subject, i.e., the patient to be examined.

SUMMARY OF THE INVENTION

An object of the present invention is to provide a solid state detector of the type initially described which can be adapted to arbitrary surface profiles.

This object is inventively achieved a solid state X-ray detector that is flexibly fashioned and includes a flexible housing, a flexible substrate with a matrix of thin-film transistors (TFT), and a flexible X-ray converter By departing from the structural principles of currently employed detectors with a rigid housing and a glass substrate, a solid state X-ray detector for mobile use is obtained which, in particular allows being the adapt to curvature radii as occur in applications such as bed exposures.

Inventively, a holding mechanism can be provided that allows a bending of the substrate in one degree of freedom to a limited extent and prevents bending in another degree of freedom. In practice, it is not necessary to adapt the detector to arbitrary surface profiles. On the contrary, it completely suffices when the flexible detector is bendable in one dimension, so that, for example, it can assume the shape of a cylindrical surface.

A measurement device can be provided to determine the bending of the substrate and a correction system connected thereto corrects image distortions in the output signals of the X-ray detector caused due to the bending.

The flexible X-ray converter can have a flexible semiconductor layer for X-ray conversion or a flexible matrix of thin-film photodiodes with a flexible scintillator.

DESCRIPTION OF THE PREFERRED EMBODIMENTS

Figure 1:
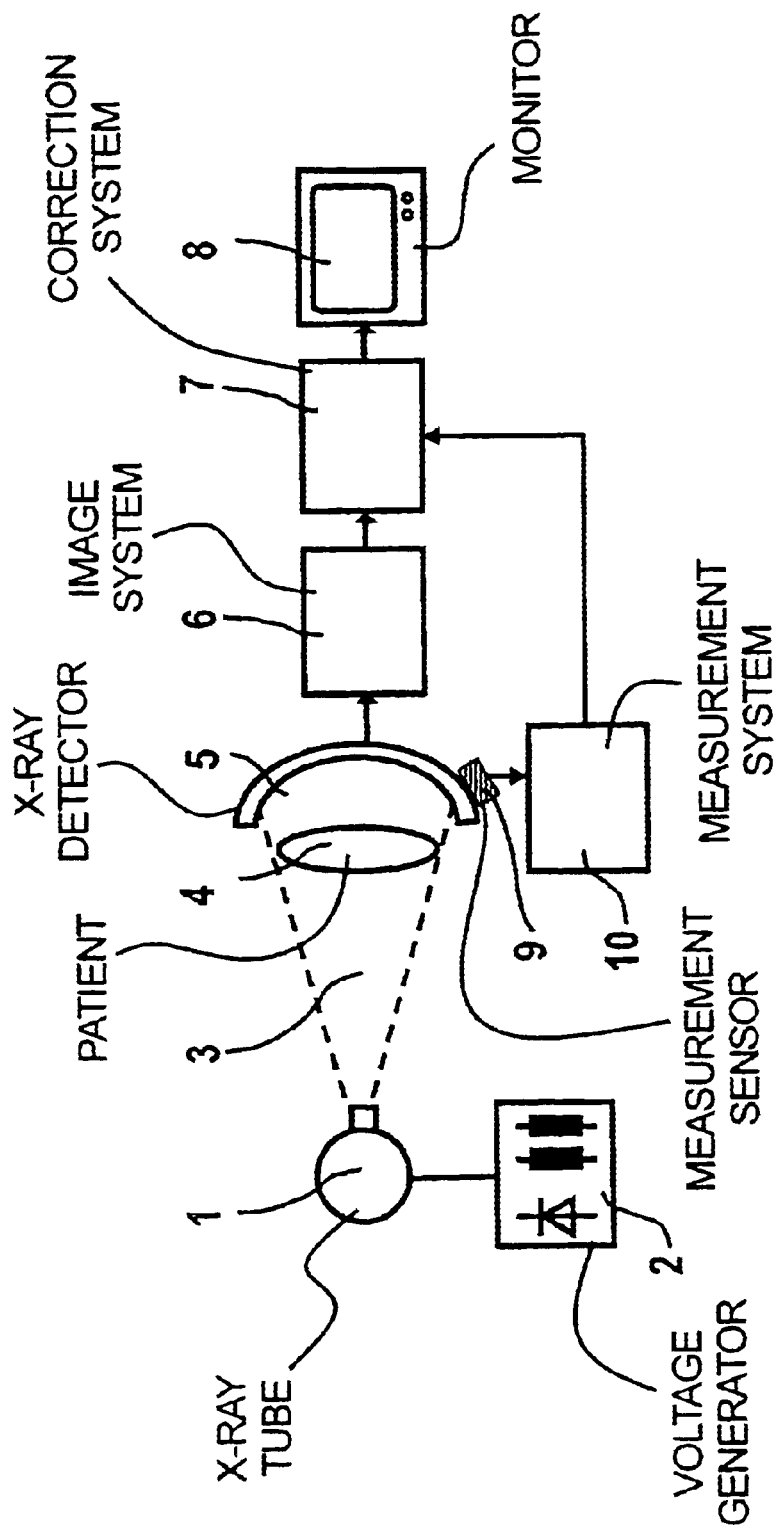
FIG. 1 is a schematic block diagram of an X-ray diagnostic installation with the inventive solid state X-ray detector.

FIG. 1 shows the basic arrangement on an X-ray diagnostic installation with the inventive solid state X-ray detector. An X-ray tube 1 that is supplied with high-voltage by a voltage generator 2 emits an X-ray beam 3 that transirradiates a patient 4 under examination. The X-rays attenuated according to the transparency of the patient 4 are converted into electrical signals by a solid state X-ray detector 5 bent into a suitable shape. The signals are processed in a known way in an image system 6 and an image produced therefrom is displayed on a monitor 8 or processed in some other way, for example stored or transmitted (not shown). The degree of bending of the X-ray detector 5 is acquired by one or more measurement sensors 9. A measurement system 10 forms a correction dataset from the output of the sensor or sensors 9 as well as from the known geometry, i.e. the relative position of X-ray tube 1 and X-ray detector 5. This correction dataset is supplied to a correction system 7 that corrects the image data dependent on the identified geometrical distortions.

Figure 2:
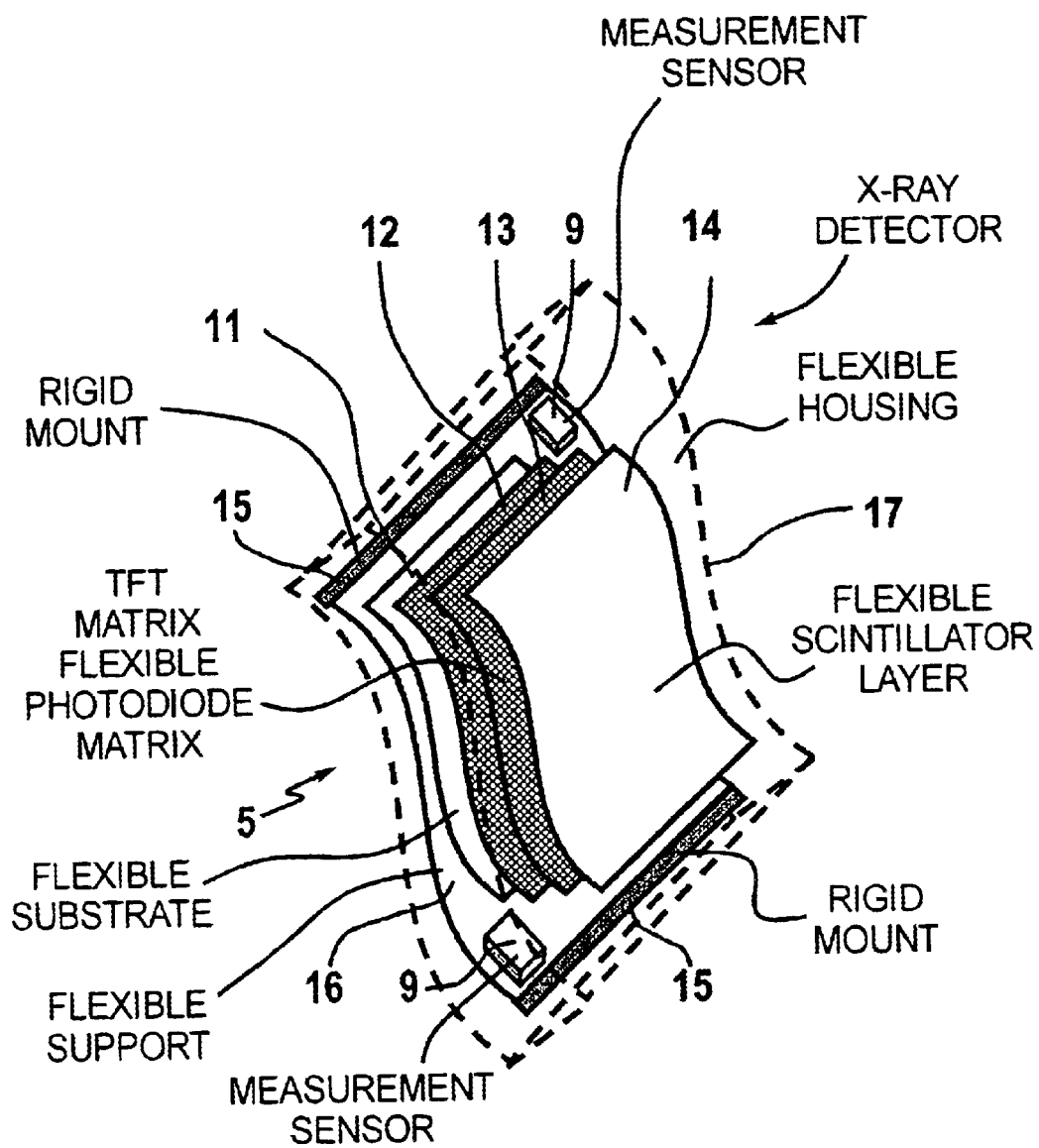
FIG. 2 illustrates a first embodiment of the solid state X-ray detector shown in FIG. 1.

FIG. 2 shows an embodiment of the X-ray detector 5. A TFT matrix 12 of thin-film transistors that are preferably constructed of amorphous silicon, but also can be composed of polycrystalline cadmium selenide is produced on a flexible substrate 11 together with the appertaining drive and readout interconnects.

A matrix 13 of photodiodes is then applied, these preferably being fashioned of amorphous silicon in a PIN structure or as Schottky diodes. These photodiodes can be arranged next to the TFT or—as shown—in a further plane above the TFT matrix 12.

A scintillator layer 14 is applied thereover as a flexible X-ray converter. This scintillator layer 14 preferably is composed of vapor-deposited cesium iodide (CsI) that is directly vapor-deposited onto the photodiode matrix 13. The structure of CsI, composed of numerous needle-shaped crystals has proven highly bendable. Alternatively, CsI can be applied onto a separate substrate and then be optically coupled.

In another embodiment, a scintillator foil can be employed, that preferably is composed of gadolinium oxisulfide powder embedded in a plastic matrix. It can be advantageous to employ a further material for the optical coupling that compensates the mechanical stresses that otherwise occur during the bending. A transparent silicone product such as, for example, SilGel 612® of Wacker is suitable for this purpose.

The overall detector arrangement is secured such that bending in one spatial direction is prevented by rigid mounts 15. The X-ray detector 5 is flexible in the spatial direction perpendicular thereto, and a support 16 limits the bending to a predetermined, minimum radius of curvature. Since the drive circuits, which are usually composed of crystalline silicon, are not bendable, it is advantageous to secure these circuits to small, rigid circuit boards and to electrically conductively connect these circuit boards to the detector substrate 11 with flexible interconnects. Alternatively, the circuits can be glued onto the substrate 11 with a soft adhesive that can compensate the bending. In this case, the contacting between the circuit and the interconnects on the substrate 11 ensues with wire bonding.

One or more measurement sensors 9 that, for example, can be implemented as wire strain gauges are applied on the support 16 in order to acquire the current degree of bending.

This overall detector arrangement is accommodated in a flexible housing 17 (indicated with broken lines).

Figure 3:
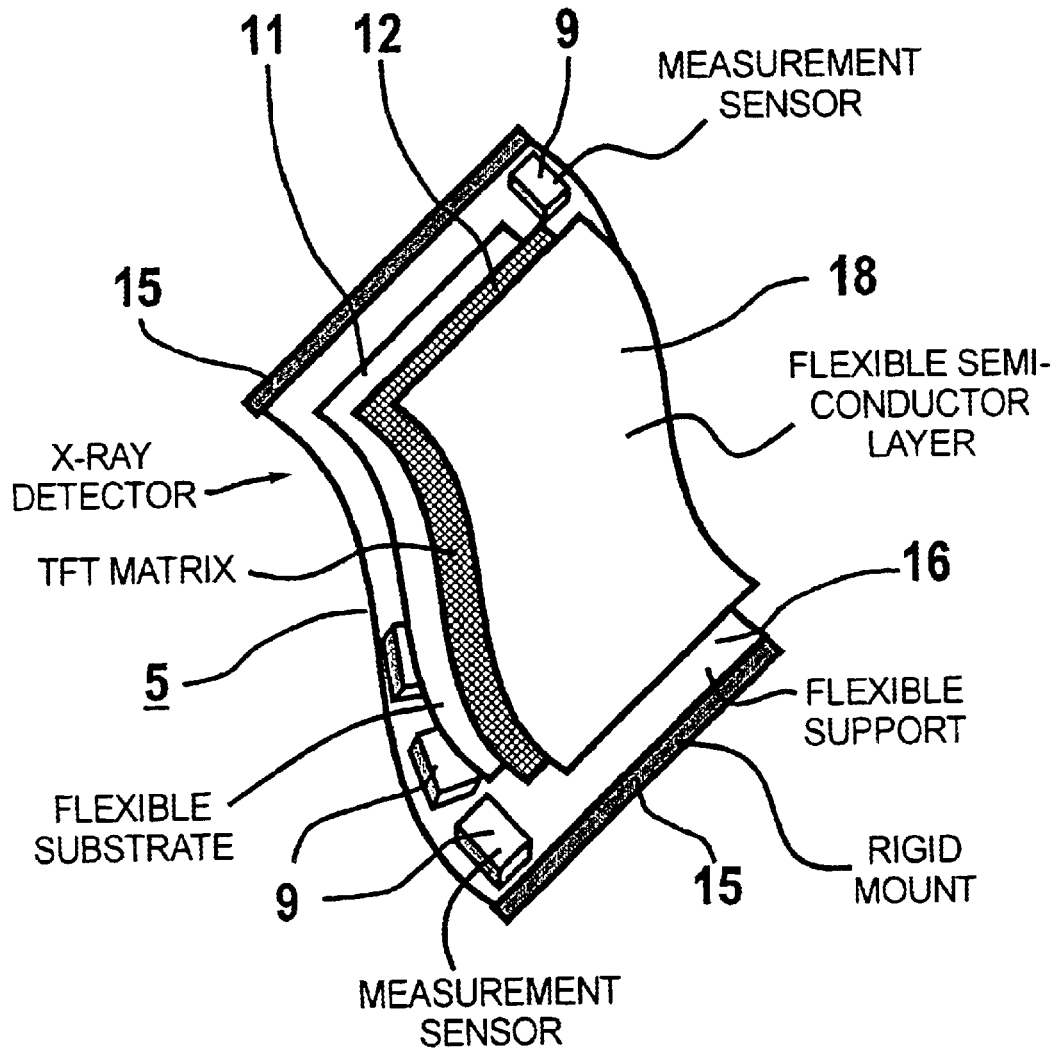
FIG. 3 illustrates a second embodiment of the inventive solid state X-ray detector.

Another embodiment of the X-ray detector 5 is shown in FIG. 3. As in the exemplary embodiment according to FIG. 2, a matrix 12 of thin-film transistors (TFT) with the appertaining drive and readout interconnects is produced on the flexible substrate 11.

A flexible semiconductor layer 18 is applied over this, the layer 18 exhibiting high absorption for X-radiation and free charge carriers being generated therein in the form of electron-hole pairs. This semiconductor layer 18 preferably is composed of amorphous selenium; however, other materials such as lead iodide, mercury iodide or lead oxide are also possible. When very thick semiconductor layers are required for a good X-ray absorption (selenium layers must be 0.5 mm through 1 mm thick for radiological applications), it can be advantageous to structure the semiconductor layer 18 so that it does not peel off or crack when the X-ray detector 5 is bent. Rifling can be etched in a direction tranverse relative to the bending direction for this purpose. Other etching patterns (honeycombs), however, are also conceivable. The holding of the X-ray detector 5 ensues as described for FIG. 2.

The entire X-ray detector 5, including the drive circuits and the readout amplifiers, is accommodated in a housing that exhibits the same flexibility as the mounts 15 and 16.

Flexible X-ray detectors 5 in accordance with the invention are suitable for medical diagnosis, particularly for bed exposures, however, they also can be advantageously utilized in other areas such as, for example, non-destructive investigations of materials.

The inventive apparatus departs from the structural principles of currently employed detectors with a rigid housing and glass substrate. It is preferably directed to an X-ray apparatus composed of an X-ray tube with a voltage generator as well as an X-ray detector in the combination of a flexible housing, a flexible substrate with a matrix of TFT, a flexible semiconductor layer for X-ray conversion or a matrix of flexible thin-film photodiodes with a flexible scintillator having a holding mechanism that allows a bending of the substrate in one degree of freedom to a limited extent and prevents it in another degree of freedom, and having a measurement device that identifies the bending, as well as correction software that corrects the image distortions.

Advantageous applications are, for example, bed exposures wherein it is possible to limit the radii of curvature of bends that occur to at most 10 cm. Moreover, it is not necessary to adapt the detector to arbitrary surface profiles. On the contrary, it completely suffices when the flexible detector is bendable in one dimension, so that, for example, it can assume the shape of a cylindrical surface.

The starting point for a detector of the inventive type is a flexible substrate. It has been shown that it is possible to produce thin-film transistors (TFT) for switching matrices with good properties on substrates such as polyethylene terephthalate (PET) [C. S. Yang et al., Journal of Vacuum Science and Technology B 18 (2000) 683–689], polyethylene naphthalate (PEN) [M. J. Lee et al., Solid-State Electronics 44 (2000) 1431–1434], polyimide (for example, Dupont Kapton®) [A. Sazonov et al., Journal of Vacuum Science and technology B 18 (2000) 780–782], polysulfone ether (PES) [S. Polach et al., Proceedings of the SPIE 3649 (199) 31–39], polycarbonate or stainless steel foils [S. D. Theiss et al., Proceedings of International Workshop on Active-Matrix Liquid-Crystal Display in conjunction with IDW'96 Kobe (1996) 365–368]. The TFT are used for displays in these references.

In order to proceed to the desired solid state X-ray detector, either an X-ray sensitive semiconductor layer such as, for example, selenium is applied onto the TFT matrix or each TFT has a photodiode allocated to it on which a scintillator is then arranged. All components must be fashioned such that they also still perform their full function when the substrate on which they are applied is bent.

Two opposite edges of the inventive detector can be rigid. The readout amplifiers that are connected to the readout lines arranged on the detector substrate are situated at these edges. The two other edges should, for example, be reinforced, such as with a resilient ledge, so that bending is only possible up to a prescribed curvature radius. The drive circuits are arranged at these edges so that they can follow the curvature. Flexible interconnects can serve this purpose, producing the contact between the detector substrate and the drive circuits.

Advantageously, a measurement that acquires the degree of curvature can be integrated at the bendable edges of the detector. This makes it possible to determine the imaging geometry of the X-ray tube—patient—detector arrangement and to correct the distortion of the acquired X-ray images with the assistance thereof.

Although modifications and changes may be suggested by those skilled in the art, it is the intention of the inventor to embody within the patent warranted hereon all changes and modifications as reasonably and properly come within the scope of his contribution to the art.

I claim as my invention:

1. In an X-ray diagnostic installation having an X-ray tube operating by a voltage generator so as to emit X-rays, a solid state X-ray detector on which said X-rays are incident, which generates electrical signals dependent on said incident X-rays, an image system which generates image signals from said electrical signals, and a playback device connected to said image system for displaying a visible image from said image signals, the improvement of said solid state X-ray detector being flexible and comprising:

a flexible X-ray converter for converting said incident X-rays into electrical charge;

a flexible substrate with a matrix of thin film transistors thereon connected to said flexible X-ray converter for reading out said electrical charge to produce said electrical signals;

a flexible housing containing said flexible substrate and said flexible X-ray converter;

a measurement device in contact with said substrate which generates a measurement signal indicating a degree of bending of said substrate; and a correction system supplied with said measurement signal for correcting image distortions in said electrical signals caused by bending of said substrate.

2. An X-ray diagnostic installation as claimed in claim 1 further comprising a holding mechanism which allows bending of said substrate in one degree of freedom to a limited extent, and prevents bending of said substrate in another degree of freedom.

3. An X-ray diagnostic installation as claimed in claim 1 wherein said flexible X-ray converter includes a flexible semiconductor layer for converting said X-rays into said electrical charge.

4. An X-ray diagnostic installation as claimed in claim 1 wherein said flexible X-ray converter comprises a flexible matrix of thin-film photodiodes with a flexible scintillator.

* * * * *